United States Patent [19]

Masuda et al.

[11] Patent Number: 5,303,250
[45] Date of Patent: Apr. 12, 1994

[54] LASER LIGHT GENERATING APPARATUS

[75] Inventors: Hisashi Masuda, Tokyo; Kiyoshi Ohsato, Chiba; Atsushi Fukumoto, Kanagawa, all of Japan

[73] Assignee: Sony Corporation, Tokyo, Japan

[21] Appl. No.: 886,091

[22] Filed: May 21, 1992

[30] Foreign Application Priority Data

May 22, 1991 [JP] Japan .................................. 3-146920

[51] Int. Cl.$^5$ .............................................. H01S 3/10
[52] U.S. Cl. .......................................... 372/38; 372/21;
372/22; 372/98; 372/92; 372/69; 359/328; 385/122
[58] Field of Search ................. 372/21, 22, 38, 92, 372/69, 70, 98; 358/328; 385/122

[56] References Cited

U.S. PATENT DOCUMENTS

| | | |
|---|---|---|
| 4,847,851 | 7/1989 | Dixon . |
| 5,027,361 | 6/1991 | Kozlovsky et al. ............... 372/21 |
| 5,065,046 | 11/1991 | Guyer ............................... 372/21 |
| 5,077,748 | 12/1991 | Kozlovsky et al. ............... 372/21 |
| 5,101,411 | 3/1992 | Terao et al. ..................... 372/21 |

FOREIGN PATENT DOCUMENTS

| | | |
|---|---|---|
| 63-7685 | 1/1988 | Japan . |
| 2125764 | 5/1990 | Japan . |
| 2161786 | 6/1990 | Japan . |

OTHER PUBLICATIONS

T. Kane, "Intensity Noise in Diode-Pumped Single-Frequency Nd:YAG Lasers and its Control by Electronic Feedback", IEEE Photonics Technology Letters, vol. 2, No. 4, Apr. 1990, pp. 244-245.

"Generation of 41mW of blue radiation by frequency doubling of a GaAlAs diode laser", Applied Physics Letters 56 (23), Jun. 4, 1990, pp. 2292-2291; W. Kozlovsky, et al.

Primary Examiner—Léon Scott, Jr.
Attorney, Agent, or Firm—Hill, Steadman & Simpson

[57] ABSTRACT

A laser light generating apparatus comprises a light source for generating an exciting light beam, a condenser lens for converging the exciting light beam from the light source, a laser medium for generating a laser light of first wavelength by the radiation of the exciting light beam supplied thereto through the condenser lens, a nonlinear optical crystal element for generating a second laser light by the radiation of the first laser light generated from the laser medium, a pair of reflecting means for constituting a laser resonator together with at least the laser medium and the nonlinear optical crystal element, a deflecting element for deflecting an optical axis of the second laser light emitted from reflecting means provided at the emitting side of the pair of reflecting means, detecting means for detecting a part of a light beam output from reflecting means disposed at the output side of the pair of reflecting means, control means for controlling the light source on the basis of a detected output from the detecting means, a base on which there are disposed at least the light source, the condenser lens, the laser medium, the nonlinear optical crystal element, the deflecting element and the detecting means and a housing for housing therein at least the light source, the condenser lens, the laser medium, the nonlinear optical crystal element, the deflecting element, the detecting means and the base.

14 Claims, 13 Drawing Sheets

LASER LIGHT GENERATING APPARATUS

BACKGROUND OF THE INVENTION

1. Field of the Invention

The present invention relates generally to laser apparatus and, more particularly to a laser light generating apparatus suitable for generating a second harmonic laser light by a nonlinear optical crystal element.

2. Description of the Prior Art

FIG. 1 of the accompanying drawings shows an arrangement of an example of a laser light generating apparatus according to the prior art.

As shown in FIG. 1, a laser diode 1 is driven by a laser diode driver 8 to generate a pumping laser light and the pumping laser light becomes incident on a convex lens 2. The pumping laser light is converged by the convex lens 2 and travels through a concave surface mirror 3 and a quarter wave plate 4 to a laser medium 5 such as an Nd:YAG laser or the like. The concave surface mirror 3 passes the pumping laser light from the laser diode 1 and reflects a fundamental wave laser light generated by the laser medium 5 which will be described later. When irradiated with the pumping laser light, the laser medium 5 generates a fundamental wave laser light within a resonator composed of mirrors 3 and 7. At that time, a heat lens 5a is formed in the laser medium 5. The fundamental wave laser light is introduced through a nonlinear optical crystal element 6 such as KTP ($KTiOPO_4$) or the like into the plane mirror 7. The reflection mirror 7 is designed to reflect the fundamental wave laser light generated by the laser medium 5 and to pass a second harmonic laser light which will be described later. The fundamental wave laser light reflected on the reflection mirror 7 becomes incident on the laser medium 5 one more time through the nonlinear optical crystal element 6.

The fundamental wave laser light emitted from the laser medium 5 in the lefthand direction of FIG. 1 is introduced through the quarter wave plate 4 to the concave surface mirror 3 and thereby reflected. The fundamental wave laser light thus reflected is introduced again into the laser medium 5 through the quarter wave plate 4. In this way, the fundamental wave laser light travels between the concave surface mirror 3 and the plane mirror 7. That is, the concave surface mirror 3, the quarter wave plate 4, the laser medium 5, the nonlinear optical crystal element 6 and the plane mirror 7 constitute a laser light resonator 9.

The positions in which the fundamental wave laser light travels are concentrated due to the action of the concave surface mirror 3 and the heat lens 5a, thereby the energy being increased. Thus, the KTP such as the nonlinear optical crystal element 6 generates a second harmonic laser light of frequency as high as twice the frequency of the fundamental wave laser light on the basis of type II phase matching. The plane mirror 7 reflects almost all of the fundamental wave laser light but allows almost all of the second harmonic laser light with the result that the second harmonic laser light is output from the resonator 9. An optical axis of the quarter wave plate 4 in the extraordinary ray direction is adjusted so as to become 45 degrees relative to the optical axis of the nonlinear optical crystal element 6 in the extraordinary ray direction. If an azimuth angle $\theta$ of the quarter wave plate 4 is set to 45 degrees, then it is possible to avoid a coupling phenomenon from taking place between two polarizing modes of the fundamental wave laser light. If a phase delay amount by the KTP provided as the nonlinear optical crystal element 6 falls within $\pm \pi/2$, then a space hole burning within the laser medium 5 can be alleviated and a longitudinal mode having a single polarizing light can be presented. As a consequence, the second harmonic laser light can be stabilized (see U.S. Pat. No. 4910740, for example).

It is proposed that this laser light generating apparatus is miniaturized more as, for example, shown in FIG. 2. According to the example shown in FIG. 2, the quarter wave plate 4, the laser medium 5 and the nonlinear optical crystal element 6 are unitarily formed. The concave surface mirror 3 is convexed at its lefhand surface in the quarter wave plate 4 (i.e., concaved to the laser medium 5 side) and deposited on the surface of the quarter wave plate 4. Similarly, the plane mirror 7 is deposited on the righthand end face of the nonlinear optical crystal element 6.

The laser light resonator 9 thus arranged, the lens 2 and the laser diode 1 are mounted on a base 12 and housed within a housing 11. A second haromic laser light is emitted from an opening portion 11a formed through the housing 11.

When the laser medium 5 is excited by the pumping laser light emitted from the laser diode 1, a reflected-back light such as a laser light, which results from reflecting the pumping laser light on the surfaces of the lens 2, the surface of the concave surface mirror 3 or the like, the fundamental wave laser light leaked from the concave surface mirror 3 or the like occurs in the laser diode 1. When supplied with the reflected-back light, the laser diode 1 is increased in noise level. If a noise occurs in the laser diode 1, when the noise produced in the laser diode 1 appears in the second harmonic laser light.

FIG. 4 of the accompanying drawings shows frequency characteristics of noise when the laser medium 5 of the laser diode 1 is not excited (no reflected-back light is produced). In FIG. 4, an upper line represents a noise of the laser diode 1 and a lower line represents a noise generated from a measuring equipment. This is also true in FIGS. 5 and 6. Whereas, FIG. 5 shows frequency characteristics of noise when the laser light resonator 9 is excited by the laser diode 1 to emit the second harmonic laser light (i.e., when the reflected-back light is produced). Having compared FIGS. 4 and 5, it is to be understood that a noise is increased by 10 dB to 15dB in the case of FIG. 5 It is considered that this increase of noise is caused by the reflected-back light.

FIG. 6 of the accompanying drawings shows a frequency characteristic of noise in the second harmonic laser light. Study of FIG. 6 teaches that a noise of a relatively large level appears in the frequency band less than about 1 MHz. This noise may be considered such that the noise produced in the laser diode as shown in FIG. 5 occurs in response to the frequency characteristic (see FIG. 3) of the laser light resonator 9.

As shown in FIG. 3, a ratio (in ordinate) of an output (P2) of the second harmonic laser light relative to an output (P1) of the pumping laser light output from the laser diode 1 is substantially constant in a range of a relatively low frequency in which the frequency (in abscissa) of the second harmonic laser light reaches a transition oscillation frequency fr. However, the above-mentioned ratio is attenuated in proportion to the square off the frequency in a range of frequency higher than the transition oscillation frequency fr. In other words, since the second harmonic laser light never responds to the fluctuation of the pumping laser light in the range of frequency higher than the transition oscillation frequency fr, there is then substantially no risk that the noise of the pumping laser light appears in the second harmonic laser light.

However, the noise of the laser diode 1 appears in the second harmonic laser light in the vicinity of the transition oscillation frequency fr or in the frequency lower than the transition oscillation frequency fr. As a consequence, if this conventional laser light generating apparatus is used to play back an optical disc, a signal-to-noise (S/N) ratio is deteriorated in the vicinity of the transition oscillation frequency fr or in the frequency lower than the transition oscillation frequency fr.

OBJECTS AND SUMMARY OF THE INVENTION

Therefore, it is an object of the present invention to provide an improved laser apparatus in which the aforesaid shortcomings and disadvantages of the prior art can be eliminated.

More specifically, it is an object of the present invention to provide a laser apparatus in which a noise of a pumping laser light can be suppressed from being produced in an output laser light.

As a first aspect of the present invention, a laser light generating apparatus comprises first means for generating a pumping laser light, second means for converging the pumping laser light, third means for generating a laser light of first wavelength by the radiation of the pumping laser light from second means, fourth means for generating a laser light of second wavelength by the radiation of the laser light of first wavelength, fifth means for detecting a part of the laser light of first or second wavelength, and sixth means for controlling an intensity of the pumping laser light in response to an output of fifth means.

As a second aspect of the present invention, a laser light generating apparatus comprises first means for generating a pumping laser light, second means for converging the pumping laser light, third means for generating a laser light of first wavelength by the radiation of the pumping laser light from second means, fourth means for generating a laser light of second wavelength by the radiation of the laser light of first wavelength, fifth means for detecting a part of the pumping laser light, sixth means for controlling an intensity of the pumping laser light in response to an output of fifth means, and seventh means for housing therein first to sixth means.

According to the laser light generating apparatus of the present invention, since the intensity of the pumping laser light is controlled in response to the output of the laser light of first or second wavelength, a noise in the pumping laser light can be suppressed.

Furthermore, in accordance with the laser light generating apparatus of the present invention, the intensity of the laser light is controlled in response to the output of the pumping laser light. Therefore, also in this case, the noise in the pumping laser light can be suppressed.

The above and other objects, features, and advantages of the present invention will become apparent from the following detailed description of illustrative embodiments thereof to be read in conjunction with the accompanying drawings, in which like reference numerals are used to identify the same or similar parts in the several views.

DETAILED DESCRIPTION OF THE PREFERRED EMBODIMENTS

The present invention will now be described in detail with reference to the drawings.

Figure 1:
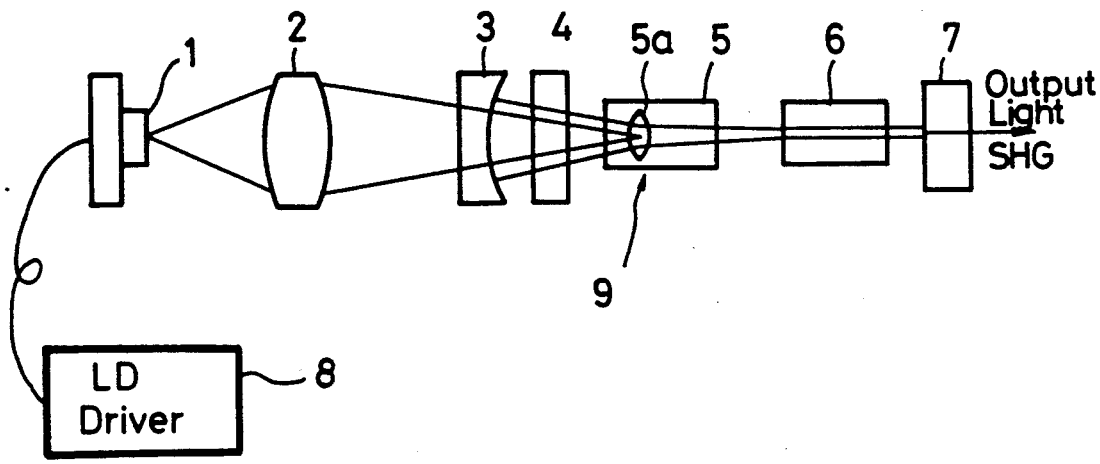
FIG. 1 is a schematic diagram showing a structure of an example of a laser light generating apparatus according to the prior art.
Figure 2:
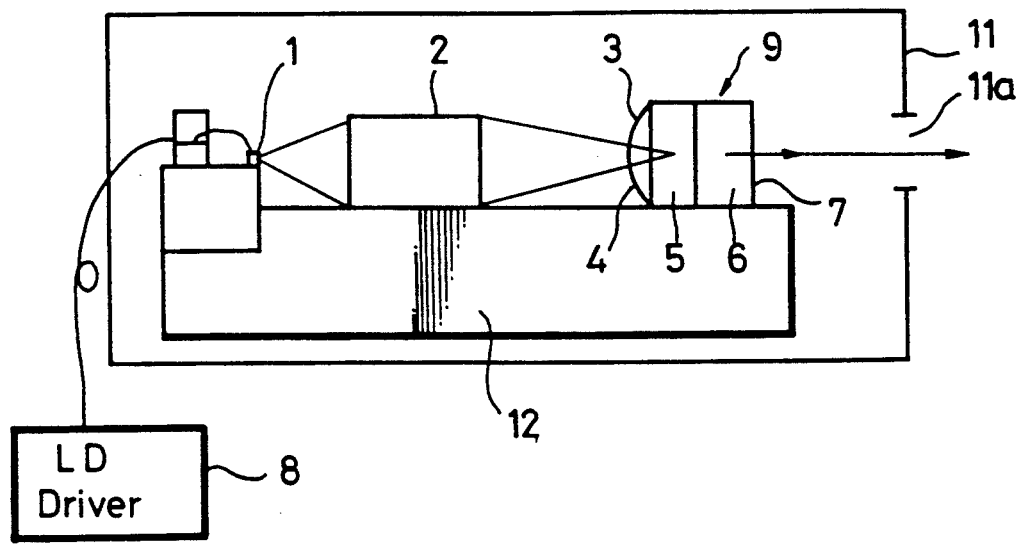
FIG. 2 is a schematic diagram showing a structure of the example of the laser light generating apparatus shown in FIG. 1 in which this laser light generating apparatus is miniaturized more.
Figure 3:
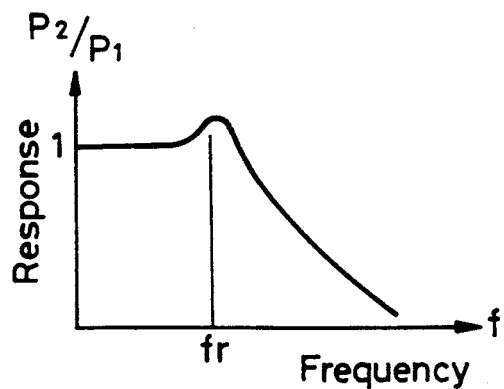
FIG. 3 is a frequency characteristic graph graphing a response characteristic of a laser light resonator shown in the example of FIG. 2.
Figure 4:
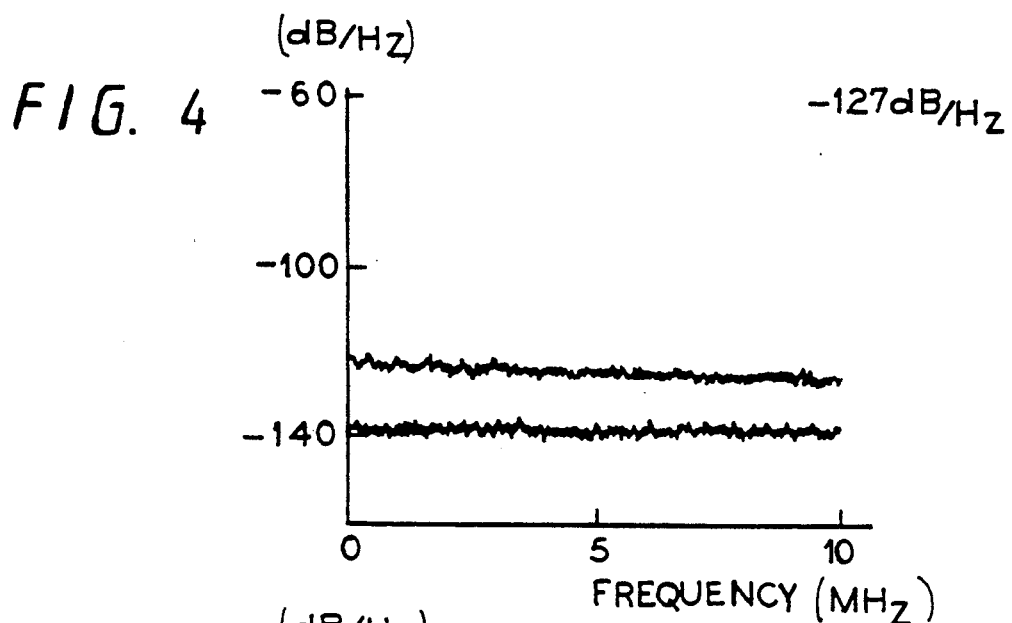
FIG. 4 is a frequency characteristic graph graphing a characteristic of a noise when there is no reflected-back light of a laser diode used in FIG. 2.
Figure 5:
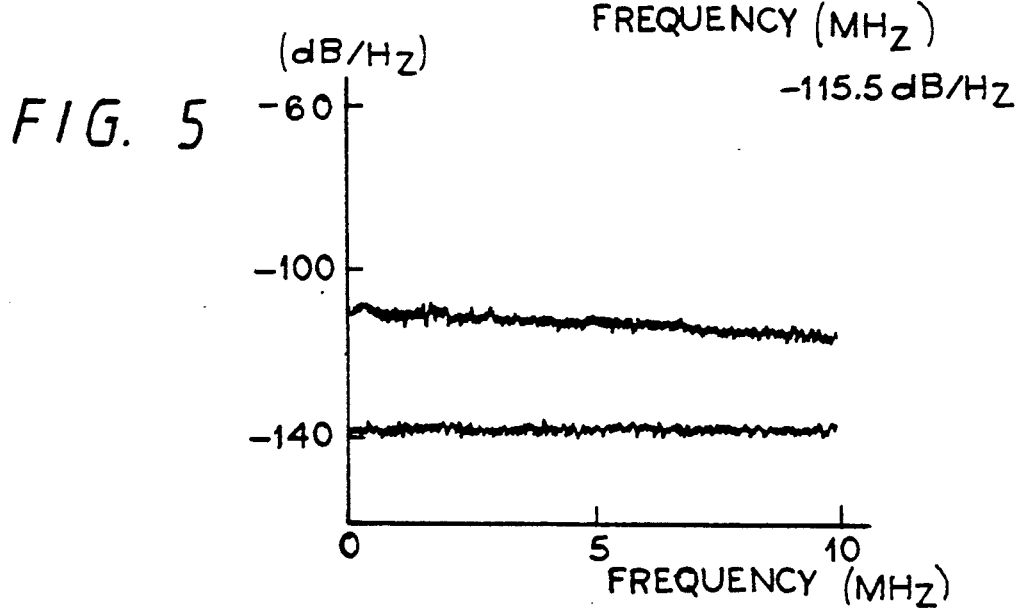
FIG. 5 is a frequency characteristic graph graphing a characteristic of a noise when there is a reflected-back light of a laser diode used in FIG. 2.
Figure 6:
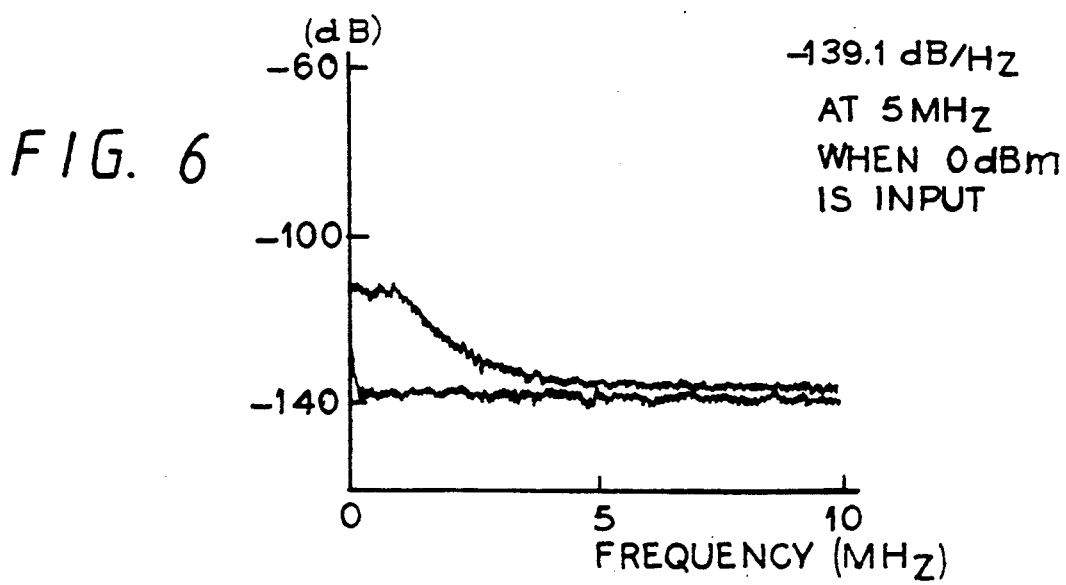
FIG. 6 is a frequency characteristic graph used to explain a noise in a second harmonic laser light output from the laser light resonator in the example shown in FIG. 2.
Figure 7:
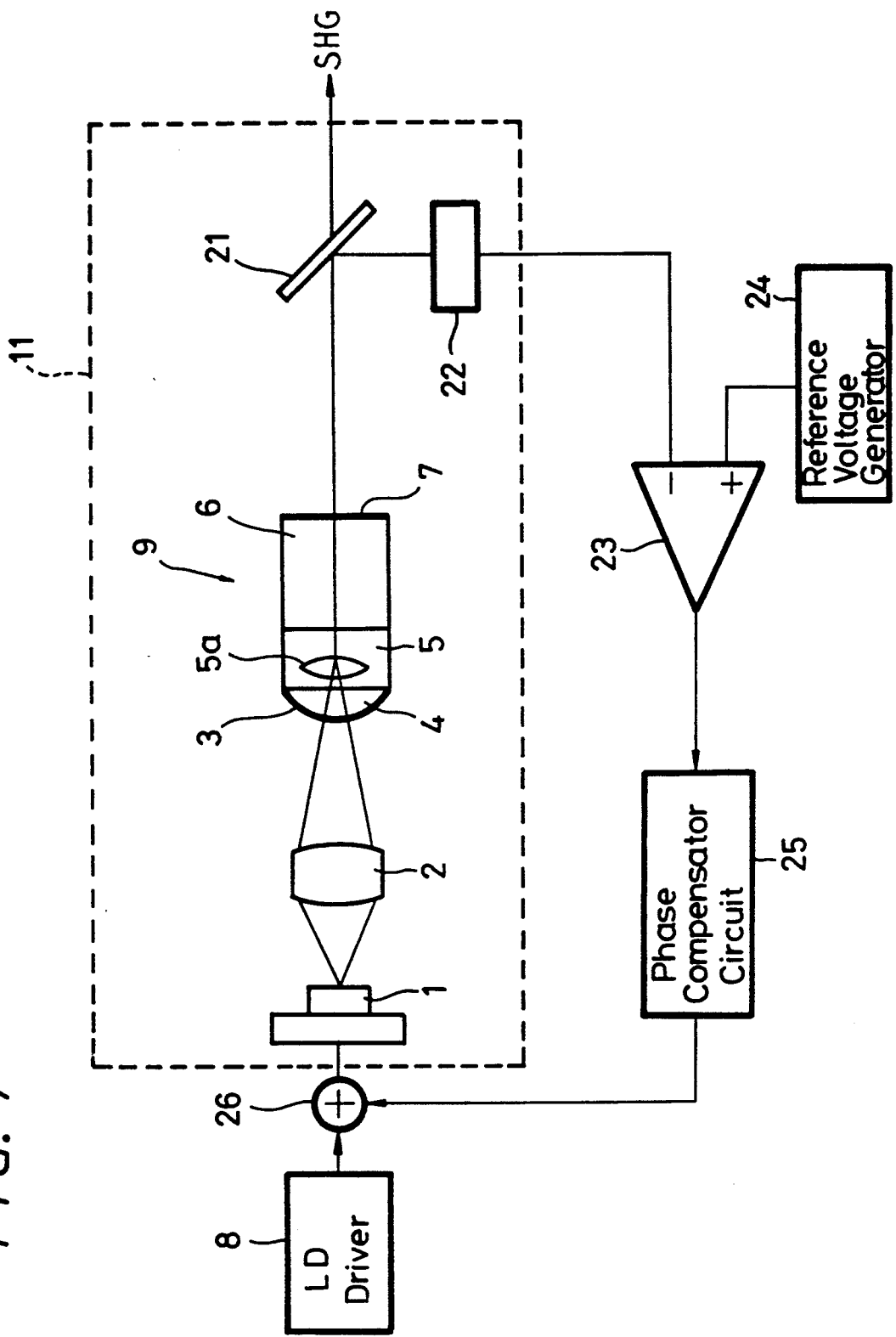
FIG. 7 is a block diagram showing an arrangement of a laser light generating apparatus according to a first embodiment of the present invention.

FIG. 7 of the accompanying drawings shows in block form a structure of a laser light generating apparatus according to a first embodiment of the present invention. In FIG. 6, like parts corresponding to those of FIGS. 1 and 2 are marked with the same references and therefore need not be described in detail.

In the first embodiment of the present invention, as shown in FIG. 7, a beam splitter 21 formed of a dichroic mirror or the like is located on an optical axis of a light path through which the laser light output from the laser light resonator 9 travels. The beam splitter 21 passes the second harmonic laser light output from the laser light resonator 9 through the plane mirror 7, while the beam splitter 21 reflects the fundamental wave laser light leaked from the plane mirror 7. The second harmonic laser light and the fundamental wave laser light leaked through the plane mirror 7 together with the second harmonic laser light are separated from the laser light emitted from the laser resonator 9 by this beam splitter 21. A photo-detector 22 detects the fundamental wave laser light reflected on the beam splitter 21 and supplies a detected output to a differential amplifier 23. The differential amplifier 23 compares the detected output of the photo-detector 22 and a reference voltage output from a reference voltage generator circuit 24 and outputs an error voltage thereof to a phase compensator circuit 25. An output signal of the phase compensator circuit 25 is supplied to an adder 26, in which it is added to a drive signal from the laser diode driver circuit 8. The laser diode 1, the lens 2, the laser light resonator 9, the beam splitter 21 and the photo-detector 22 are housed within the housing 11. A rest of the structure shown in FIG. 7 is similar to that of the laser apparatus shown in FIG. 2. The concave surface mirror 3 is convexed to the space but functions as the concave surface mirror within the laser light resonator 9.

Operation of the laser light generating apparatus according to the first embodiment of the present invention will be described below.

The laser diode 1 is driven by the laser diode driver circuit 8 to output a pumping laser light. The pumping laser light is converged by the convex lens 2 and introduced through the concave surface mirror 3 and the quarter wave plate 4 into the laser medium 5. The laser light resonator 9 formed by the concave surface mirror 3 and the plane mirror 7 generates a fundamental wave laser light. At that time, the heat lens 5a also is formed in the laser medium 5 at the incident position of the pumping laser light. The fundamental wave laser light becomes incident on the nonlinear optical crystal element 6 and the nonlinear optical crystal element 6 generates a second harmonic laser light. The second harmonic laser light is resonated between the plane mirror 7 and the concave surface mirror 3 to thereby increase the energy level thereof and then output from the plane mirror 7 to the outside of the laser light resonator 9.

The second harmonic laser light output from the laser light resonator 9 passes the beam splitter 21 and travels to the outside of the housing 11. Although the plane mirror 7 in the laser light resonator 9 is designed to pass the second harmonic laser light and to reflect the fundamental wave laser light, the plane mirror 7 cannot reflect the fundamental wave laser light completely. Accordingly, the leaked component of the fundamental wave laser light from the plane mirror 7 is output from the laser light resonator 9 together with the second harmonic laser light. In this fashion, the fundamental wave laser light output from the laser light resonator 9 is reflected by the beam splitter 21 and thereby separated from the second harmonic laser light, which is then introduced into the photo-detector 22.

The photo-detector 22 outputs a voltage corresponding to the level of the detected fundamental wave laser light to the differential amplifier 23. The differential amplifier 23 compares the voltage output from the photo-detector 22 and the reference voltage output from the reference voltage generator circuit 24 and outputs the error voltage to the phase compensator circuit 25. The phase compensator circuit 25 compensates the output of the differential amplifier 23 to a predetermined phase characteristic, and supplies the thus phase-compensated output to the adder 26. The adder 26 adds the control signal input from the phase compensator circuit 25 and the output signal from the laser diode driver circuit 8, and the laser diode 1 is driven by an added signal from the adder 26. In this way, the laser diode 1 is controlled so that the level of the fundamental wave laser light output from the laser light resonator 9 becomes equal to a predetermined reference value determined by the reference voltage generator circuit 24.

The laser diode 1 can output a laser light of 200 mW at a current of 400 mA, for example, thereby generating a fundamental wave laser light of 1.046 $\mu$m, accordingly, a second harmonic laser light of 0.53 $\mu$m.

When the laser light resonator 9 is oscillated in the single mode and set in the quasi-stable state, the fluctuating amount of the second harmonic laser becomes proportional to that of the fundamental wave laser light and the second harmonic laser light and the fundamental wave laser light become the same in phase. Also, the fluctuating amount of the fundamental wave laser light becomes proportional to that of the pumping laser light in the low frequency band. Therefore, a noise caused by the reflected-back light to the laser diode 1, accordingly, a noise appearing in the second harmonic laser light can be suppressed by the above-mentioned feedback loop.

Figure 8:
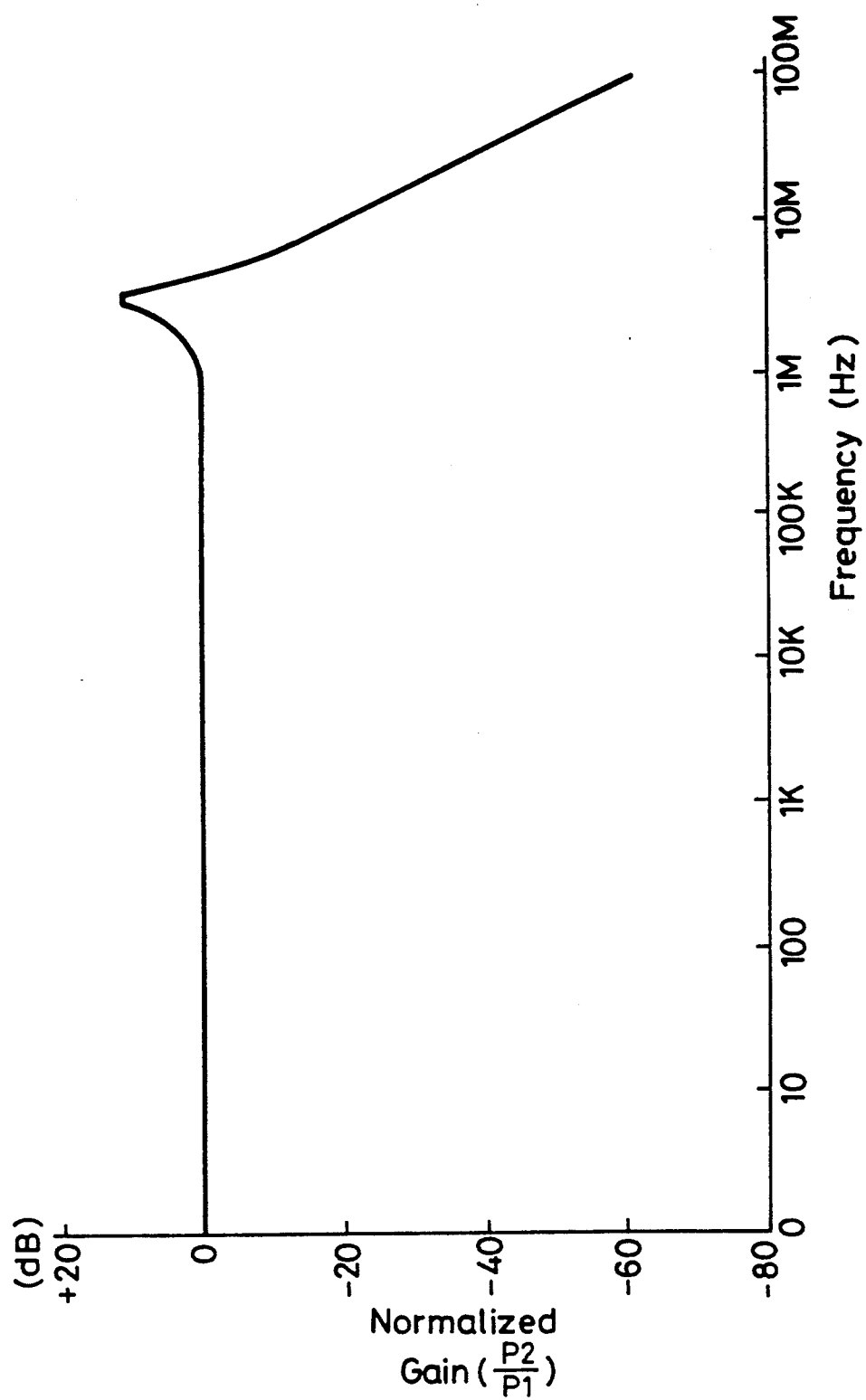
FIG. 8 is a graph used to explain a gain characteristic of a laser light resonator in the first embodiment.

A ratio (i.e., relative gain) between the output fluctuated amount P2 of the second harmonic laser light and the output fluctuated amount P1 of the pumping laser light output from the laser diode 1 has a frequency characteristic shown in FIG. 8. Study of FIG. 8 demonstrates a frequency characteristic such that a normalized gain is substantially constant in the low frequency band up to about 1 MHz, presents small peaks in the vicinity of the transition oscillation frequency of about 3 MHz and is lowered gradually in the frequency band higher than the transition oscillation frequency.

Figure 9:
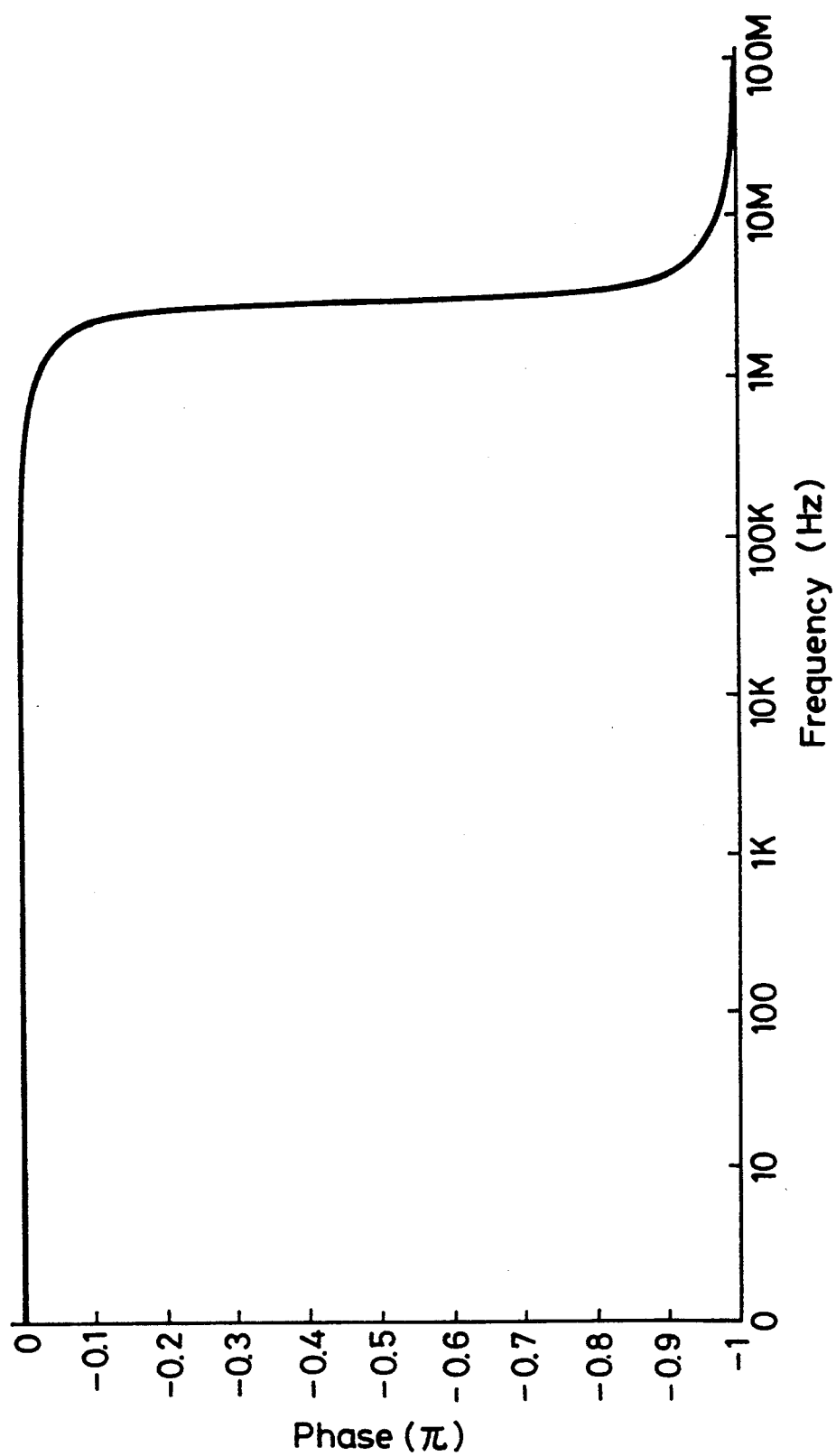
FIG. 9 is a graph used to explain a phase characteristic of the laser light resonator in the first embodiment.

FIG. 9 of the accompanying drawings shows a phase characteristic of the laser light resonator 9. As shown in FIG. 9, a rotation of phase does not occur in the low frequency band up to about 1 MHz but the rotation of phase occurs in the vicinity of the transition oscillation frequency near about 3 MHz. Then, the phase is rotated 180 degrees in the frequency band higher than the transition oscillation frequency.

Figure 10A:
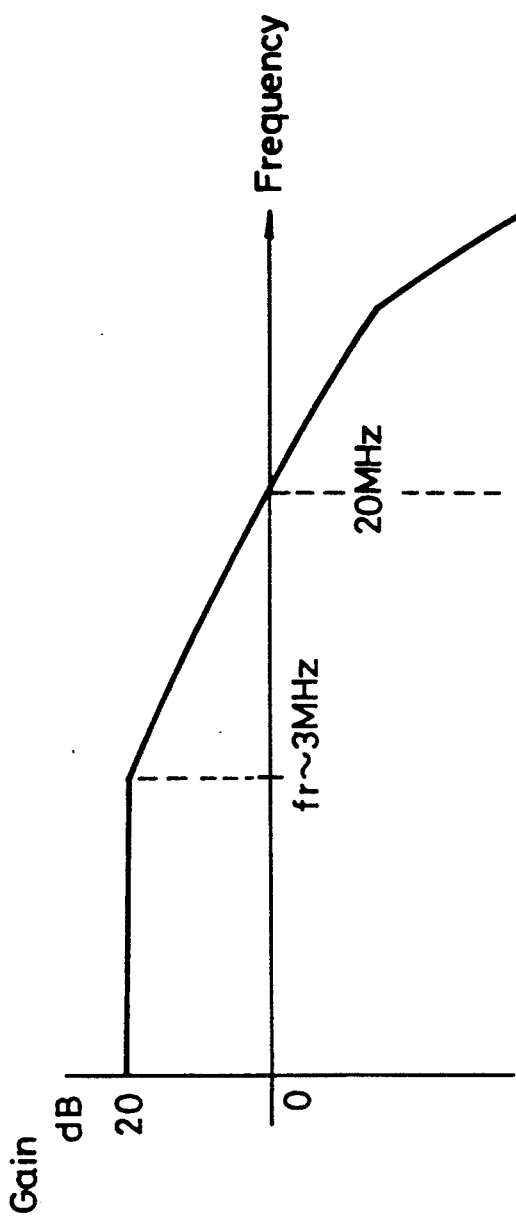
FIGS. 10A and 10B are respectively graphs used to explain characteristics of a phase compensator circuit in the first embodiment.
Figure 10B:
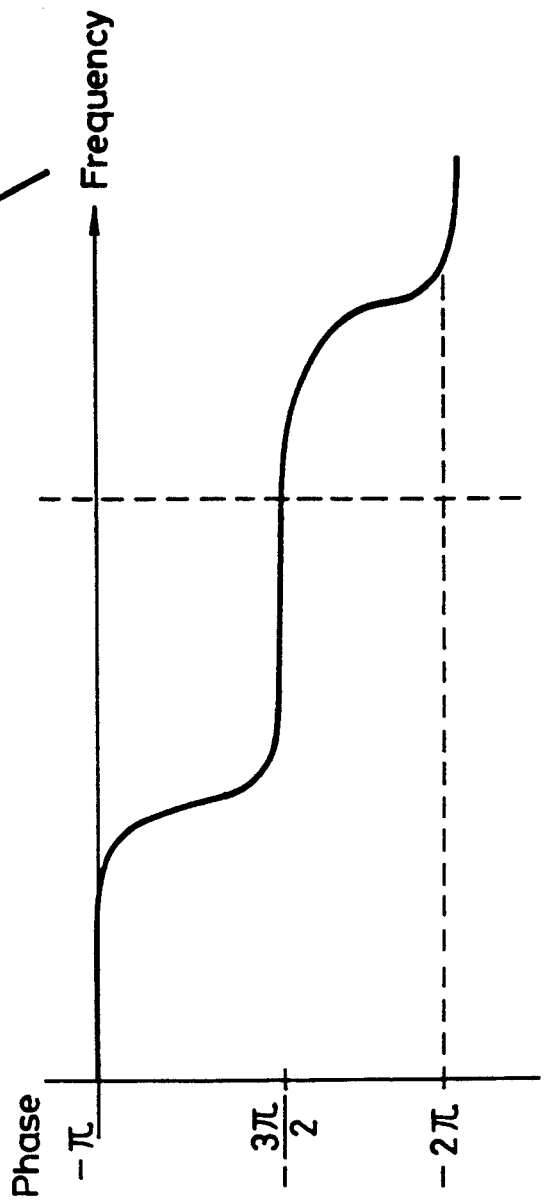

Therefore, considering the normalized gain and the rotation of phase, the phase compensating characteristics in the phase compensator circuit 25 are set as shown in FIGS. 10A and 10B.

Figure 11:
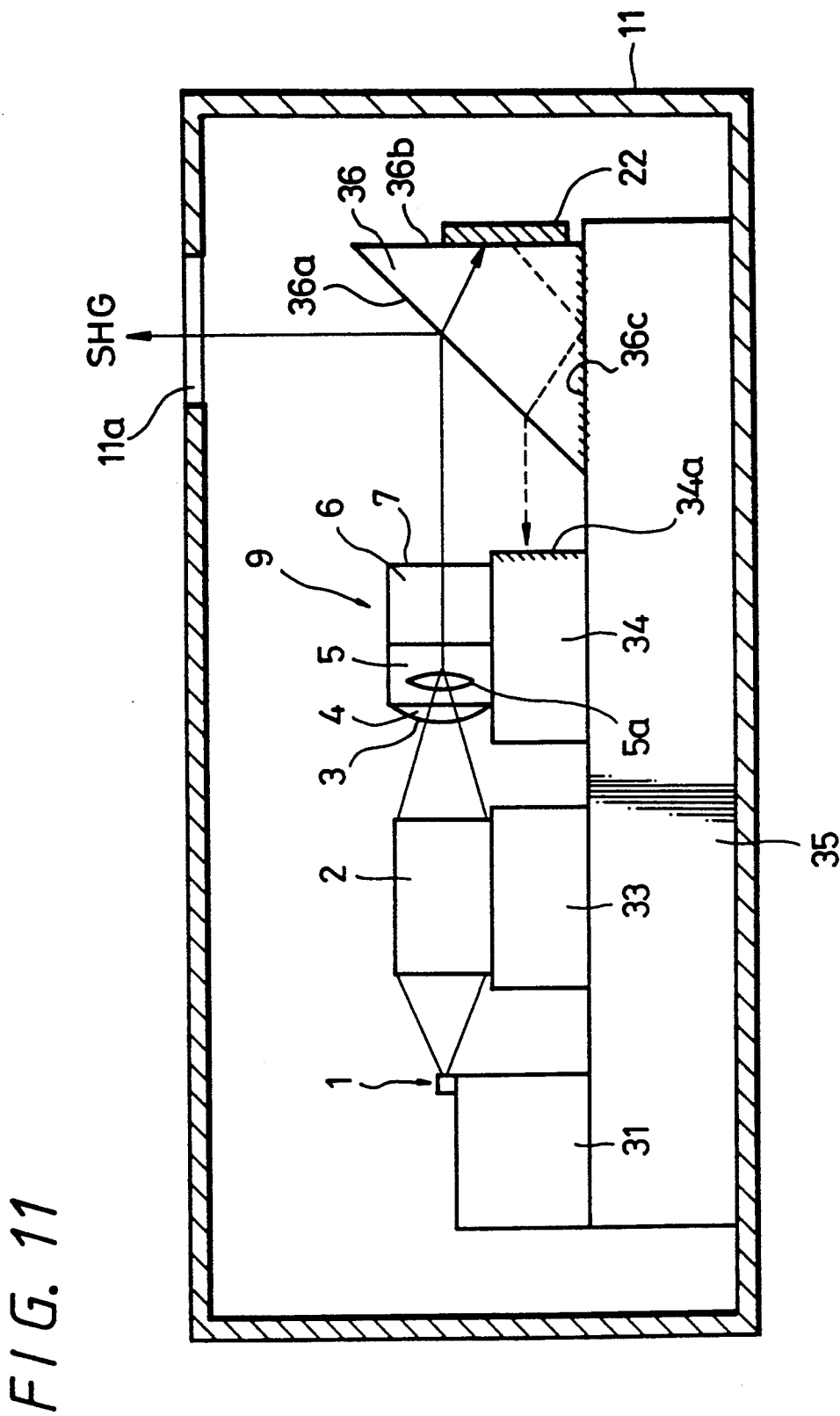
FIG. 11 is a side view illustrating an arrangement of the laser light generating apparatus according to a second embodiment of the present invention.

FIG. 11 of the accompanying drawings shows a second embodiment of the present invention, and to which references will be made in fully explaining how the respective elements shown in the first embodiment of FIG. 7 are disposed in actual practice Similarly to FIG. 7, in FIG. 11, like parts corresponding to those of FIGS. 1 and 2 are marked with the same references and therefore need not be described in detail.

According to the second embodiment of the present invention, as shown in FIG. 11, the laser diode 1 is disposed on a thermoelectric cooler 35 by way of a heat sink 31. Further, the lens 2 is disposed on the thermoelectric cooler 35 by way of a base 33 and the laser light resonator 9 also is disposed on the thermoelectric cooler 35 by way of a base 34.

While the beam splitter 21 is formed of a parallel planar plate on which a multi-layer having a wavelength selecting property is formed as described in the first embodiment shown in FIG. 7, a beam splitter 36 is formed of a triangular prism according to the second embodiment shown in FIG. 11. As shown in FIG. 11, the beam splitter 36 has on one end face 36a thereof formed a multi-layer having a wavelength selecting property, i.e., a dichroic layer which reflects the second harmonic laser light output from the laser light resonator 9 and which passes the fundamental wave laser light. The photo-detector 22 is attached to another end face 36b of the beam splitter 36. An end face 36c of the beam splitter 36 is attached to the thermo-electric cooler 35.

The end face 36c of the beam splitter 36 and an end face 34a of the base 34 have formed thereon reflection-preventing films so as to prevent the fundamental wave laser light reflected by the photo-detector 22 from being reflected or they are corrugated, i.e., concaved and convexed irregularly, whereby a reflected-back light of the fundamental wave laser light can be reduced.

These elements are housed within the housing 11 and the housing 11 has formed therethrough the opening portion 11a from which the second harmonic laser light is output.

While the leaked component of the fundamental wave laser light from the laser resonator 9 is detected by the photo-detector 22 according to the first or second embodiment, a part of the second harmonic laser light may be separated and the level thereof may be detected. In this case, the beam splitter 21 or 36 has deposited thereon a multi-layer so as to reflect or to pass a part of the second harmonic laser light.

The second harmonic laser light has a second response characteristic relative to a very small fluctuation of the laser diode 1 in the stationary oscillation state. Accordingly, the noise caused by the reflected-back light to the laser diode 1, i.e., the noise of the second harmonic laser light can be suppressed by controlling the intensity of the laser diode 1 by monitoring the second harmonic laser light.

While the fundamental wave laser light or second harmonic laser light is monitored in the first or second embodiment shown in FIG. 7 or 11, the pumping laser light output from the laser diode 1 may be monitored. When the laser light emitted from the laser diode 1 is monitored, it is frequently observed that a rear output light, which is not introduced into the lens 2, is monitored. However, although this rear output light (which is not the pumping light in actual practice) becomes substantially the same in phase as a front output light (pumping light) in a range in which the frequency thereof is relatively low, a correlation between it and the front output light is weakened as the frequency is relatively increased.

Accordingly, when a frequency band of at most several 100s of kilohertz is monitored and the DC output of the laser diode is stabilized such as in the conventional APC (automatic power control) operation, the rear output light can be monitored. However, the rear output light cannot be used to effect the feedback operation in order to suppress a noise near 1 MHz like the embodiments of the present invention. For this reason, it is preferable that, of the laser lights emitted from the laser diode 1, the front output light, i.e., the laser light which actually pumps the laser medium 5 is monitored.

Figure 12:
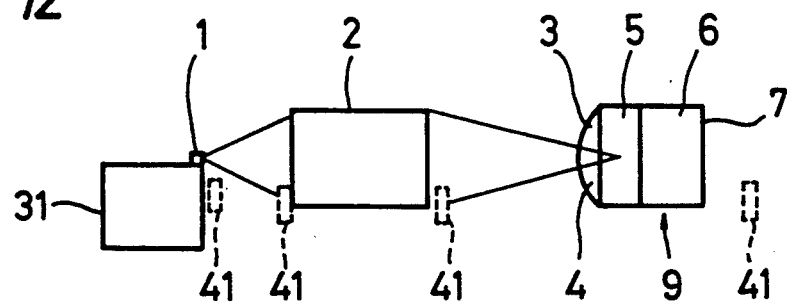
FIG. 12 is a schematic diagram used to explain a position at which a photo-detector is disposed in the laser light generating apparatus according to a third embodiment of the present invention.
Figure 13:
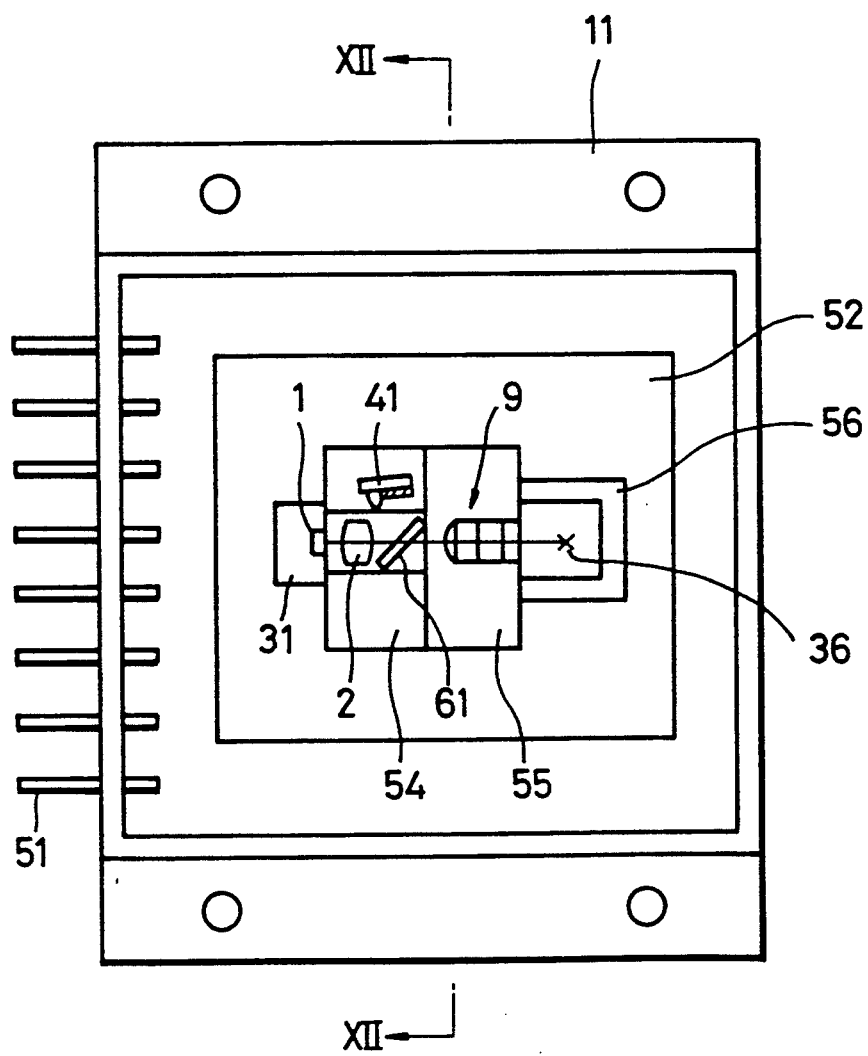
FIG. 13 is a plan view illustrating an arrangement of the the laser light generating apparatus according to a fourth embodiment of the present invention.
Figure 14:
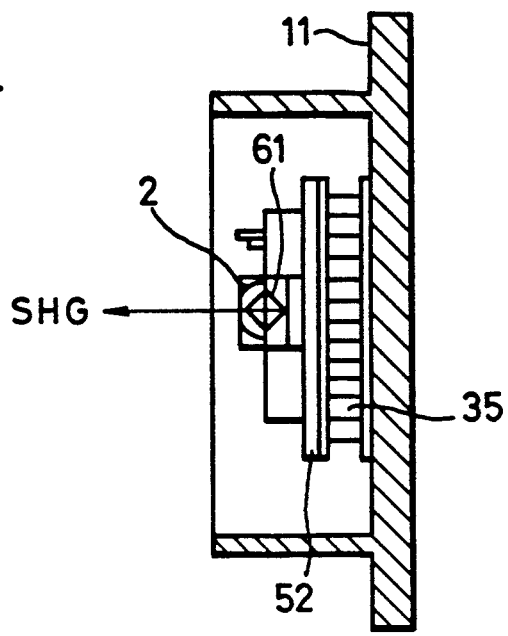
FIG. 14 is a cross-sectional view taken along the line XII—XII in FIG. 13.
Figure 15:
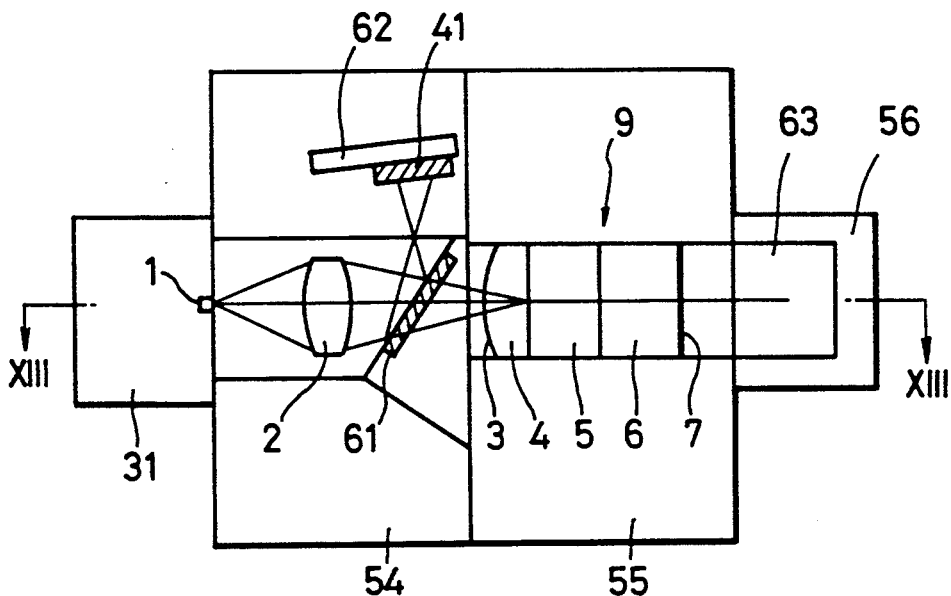
FIG. 15 is a fragmentary plan view illustrating the fourth embodiment of FIG. 13 in an enlarged scale.
Figure 16:
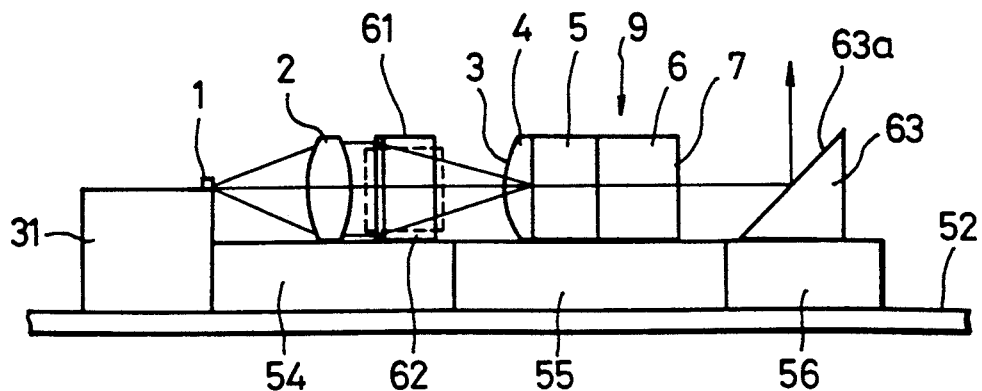
FIG. 16 is a cross-sectional side view taken along the line XIII—XIII in FIG. 15.

In order to monitor the front output light, it is proposed to dispose photo-detectors 41 at respective positions as shown in FIG. 12 which shows a third embodiment of the present invention. More specifically, the photo-detectors 41 can be disposed near the laser diode 1, just in front of the convex lens 2 or just after the convex lens 2 or just after the laser light resonator 9 as shown by phantoms in FIG. 12. Therefore, by controlling the laser diode 1 in response to the output of the photo-detector 41, the noise in the laser diode 1 due to the reflected-back light can be suppressed similarly as described before.

In the third embodiment shown in FIG. 12, only a laser light in a part of space of the monitoring laser light distributed spatially is detected. However, according to this arrangement, even when the transverse mode is unstable and the whole quantity of light is constant, a spatial distribution is frequently fluctuated depending upon the laser diode. In the third embodiment shown in FIG. 12, an influence exerted by the fluctuation of the spatial distribution cannot be avoided. Therefore, the laser apparatus is preferably arranged as shown in FIGS. 13 through 16.

In a fourth embodiment shown in FIGS. 13 through 16, the housing 11 is provided with terminals 51 so as to interchange an electrical signal between the inside and the outside. The thermo-electric cooler 35 is provided within the housing 11 and a base plate 52 is disposed on the thermo-electric cooler 35. The heat sink 31 and units 54, 55, 56 are disposed on the base plate 52. These units 54, 55, 56 have recesses of V-letter configuration (not shown) so that optical parts can be disposed, positions can be adjusted and optical adjustment can be effected, as will be described later.

The laser diode 1 is attached to the heat sink 31. The unit 54 includes the lens 2, a beam splitter 61 formed of a parallel planar plate on which a dielectric multi-layer is formed and the photo-detector 41 attached to a base 62 for detecting a laser light reflected by the beam splitter 61. The photo-detector 41 is disposed on the base 62 with a small inclination relative to the optical axis of an incident light from the lens 2 in order to reduce the reflected-back light to the laser diode 1. Also, the photo-detector 41 is disposed at the position slightly displaced to the focusing direction from a properly-focused position of the lens 2 in order to reduce the reflected-back light to the laser diode 1.

The unit 55 includes the laser resonator 9 composed of the quarter wave plate 4 on which surface there is formed the concave surface mirror 3, the laser medium 5 and the nonlinear optical crystal element 6 on one surface of which the plane mirror 7 is formed. The unit 56 includes a mirror 63 which reflects the second harmonic laser light input thereto from the laser light resonator 9 by 90 degrees. In addition, thermistors are attached to the heat sink 31, the base plate 52, the unit 55 or the like in order to detect temperatures thereof, though not shown. The thermo-electric cooler 3 is driven in response to the temperatures thus detected so as to prevent the temperatures of the respective portions from increasing excessively. Simultaneously, the laser diode 1 and the laser light resonator 9 are kept at constant temperatures. A rest of arrangement is similar to that of the second embodiment shown in FIG. 11.

According to the fourth embodiment, the pumping laser light output from the laser diode 1 is converged by the lens 2 and introduced through the beam splitter 61, the concave surface mirror 3 and the quarter wave plate 4 into the laser medium 5, whereby the second harmonic laser light is generated from the laser light resonator 9 similarly to the aforementioned embodiments. The second harmonic laser light is reflected on a reflection surface 63a of the mirror 63 and output in the direction perpendicular to the bottom surface of the housing 11.

The beam splitter 61 reflects a part of the pumping laser light output from the lens 2 over a range of the entire spatial distribution of this pumping laser light and the reflected laser light becomes incident on the photo-detector 41. Accordingly, even when the spatial distribution of the pumping laser light output from the laser diode 1 is fluctuated locally, if the whole quantity of light is constant, then the quantity of light sensed by the photo-detector 41 becomes constant. Thus, if the output of the photo-detector 41 is compared with a predetermined reference voltage and the laser diode 1 is driven in response to a resultant error signal, then the noise in the laser diode 1 can be suppressed similarly as described above.

Figure 17:
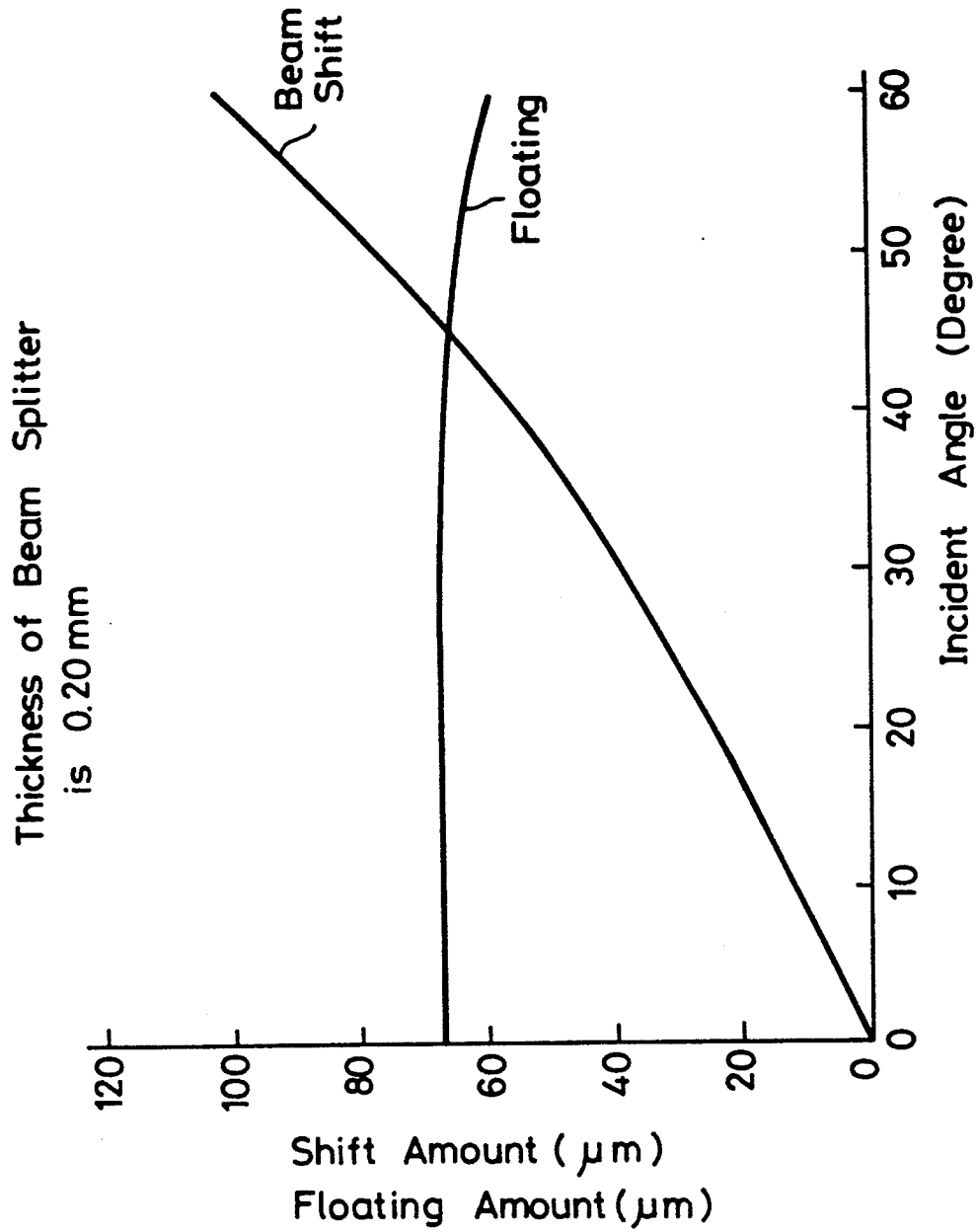
FIG. 17 is a graph used to explain a beam shift and a floating caused by a beam splitter shown in FIG. 15 wherein a thickness of the beam splitter is selected to be 0.20 mm.
Figure 18:
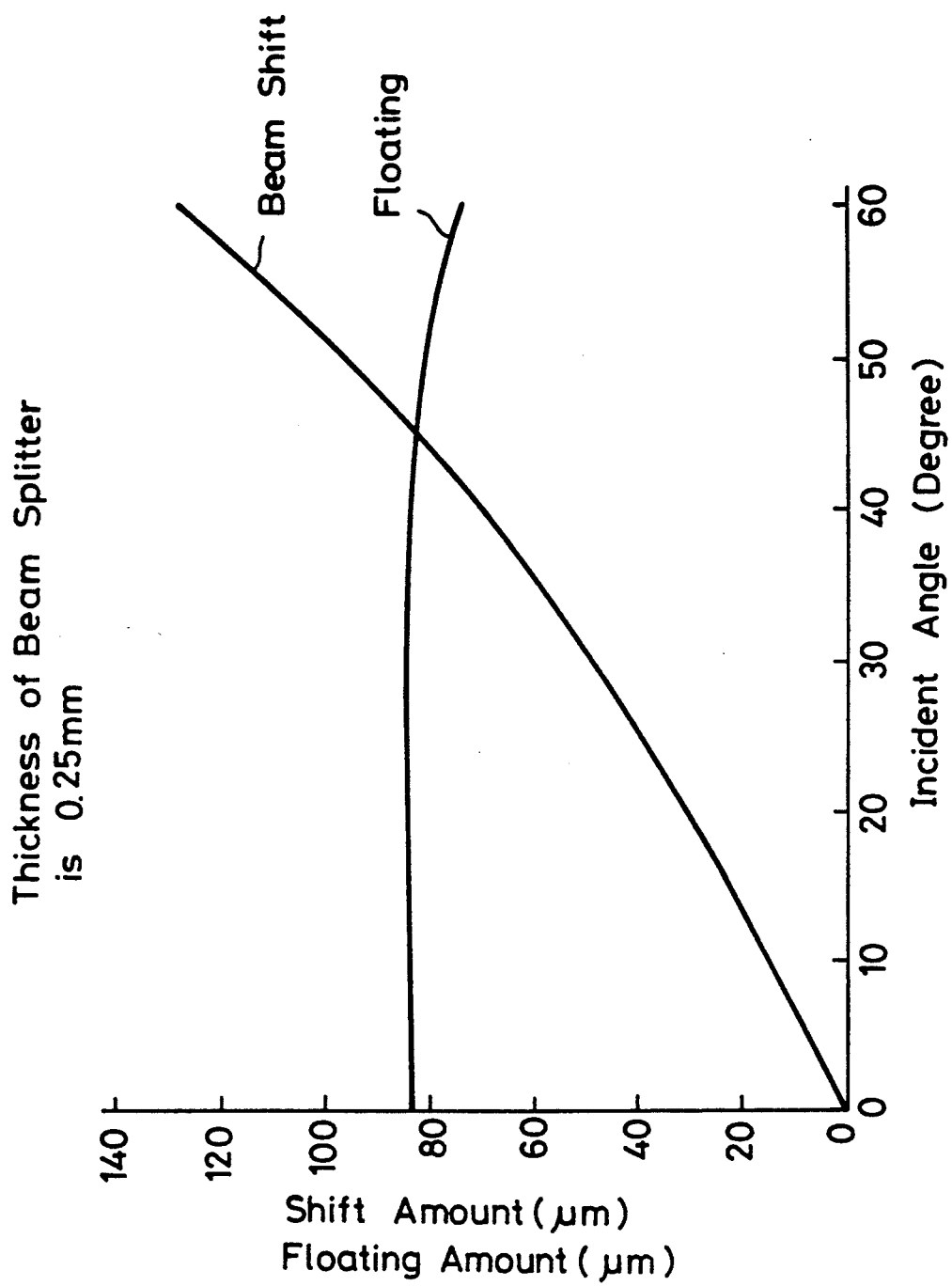
FIG. 18 is a graph used to explain a beam shift and a floating caused by the beam splitter shown in FIG. 15 wherein a thickness of the beam splitter is selected to be 0.25 mm.

If the parallel planar plate (i.e., beam splitter 61) is disposed in the light path of the converged light, then floating and beam shift phenomena occur. That is, when the parallel planar plate is interposed in the light path, a focal length is extended due to the thickness and refractive index of the parallel planar plate as compared with the case such that the parallel planar plate is not interposed (this phenomenon will be referred to as a floating phenomenon). Further, the optical axis of the laser light is shifted in parallel (this phenomenon will be referred to as a beam shift). FIGS. 17 and 18 show beam shift and floating characteristics. FIG. 17 shows measured results when the thickness of the parallel planar plate is 0.20 mm and FIG. 18 shows measured results when the thickness of the parallel planar plate is 0.25 mm. In both cases, a refractive index of the material forming the beam splitter 61 is selected to be 1.5.

Considering the floating and the beam shift, the photo-detector 41 is disposed at the predetermined position. In a like manner, considering the floating, a distance between the unit 54 (lens 2) and the unit 55 (laser light resonator 9) is set and a relative position of the unit 55 to the unit 54 is adjusted in the horizontal direction (upper and lower direction in FIG. 15 and the direction perpendicular to the sheet of drawing in FIG. 16) in response to the beam shift.

In the fourth embodiment shown in FIGS. 13 through 16, the laser diode 1 is disposed so as to set the active layer thereof in the horizontal direction.

Figure 19:
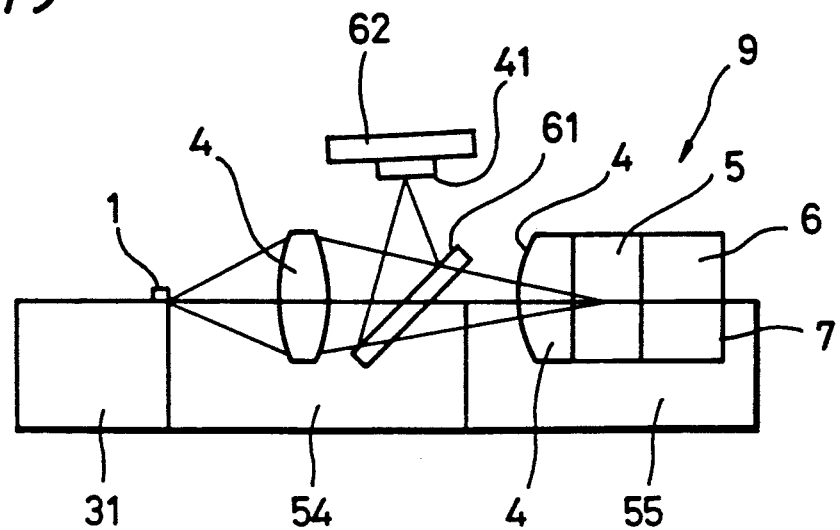
FIG. 19 is a block diagram showing an arrangement of a comparative example which is compared with the third embodiment.

Further, while the laser diode 1 is disposed such that an optical axis of a laser light traveling from the beam splitter 61 to the photo-detector 41 becomes parallel to the base plate 52, i.e., the optical axis is placed within the horizontal plane in the fourth embodiment, the laser diode 1 can be disposed such that the optical axis becomes perpendicular to the base plate 52 as shown in a comparative example of FIG. 19. However, if the laser diode 1 is disposed such that the optical axis becomes perpendicular to the base plate 52 as described above, then the adjustment becomes difficult and also astigmatism is increased. For this reason, it is preferable that the laser diode 1 is disposed such that the optical axis is placed within the horizontal plane as shown in the fourth embodiment of FIGS. 13 through 16. According to this arrangement, the astigmatism of the laser diode 1 can be suppressed to be small by properly selecting the refractive index, the thickness and the incident angle of the beam splitter 61.

When the beam splitter 61 is disposed between the laser diode 1 and the lens 2, the photo-detector 41 is disposed in the diverging optical path. Therefore, the beam splitter 61 must be disposed at the position near the laser diode 1 or a convergent lens must be disposed between the beam splitter 61 and the photo-detector 41, which unavoidably increases the number of assembly parts.

Further, the following proposal is made:

The lens 2 is separated into a collimator lens and a condenser lens and the beam splitter 61 is interposed between the collimator lens and the condenser lens. Then, the photo-detector 41 is disposed so as to receive a laser light separated by the beam splitter 61. Also in this case, a condenser lens must be disposed between the beam splitter 61 and the photo-detector 41, which unavoidably increases the number of assembly parts.

Furthermore, when the photo-detector 41 is disposed just after the laser light resonator 9 to detect the pumping laser light, the detection of the pumping laser light per se becomes impossible. In addition, when the photo-detector 41 is disposed just behind the laser light resonator 9, even if the energy of the whole spatial distribution is collected, then the following contradiction occurs:

If the wavelength of the laser diode 1 is shifted by a temperature, an aging change or the like, when the absorption of the pumping laser light in the laser light resonator 9 is decreased, the second harmonic laser light also is decreased, while the level of the pumping laser light detected behind the laser light resonator 9 is increased by the degree corresponding to the decreased amount of the absorption in the laser light resonator 9. As a consequence, the accurate servo cannot be realized.

Therefore, it is preferable that the beam splitter 61 is disposed between the lens 2 and the laser light resonator 9 as in the fourth embodiment shown in FIGS. 13 through 16.

Figure 20:
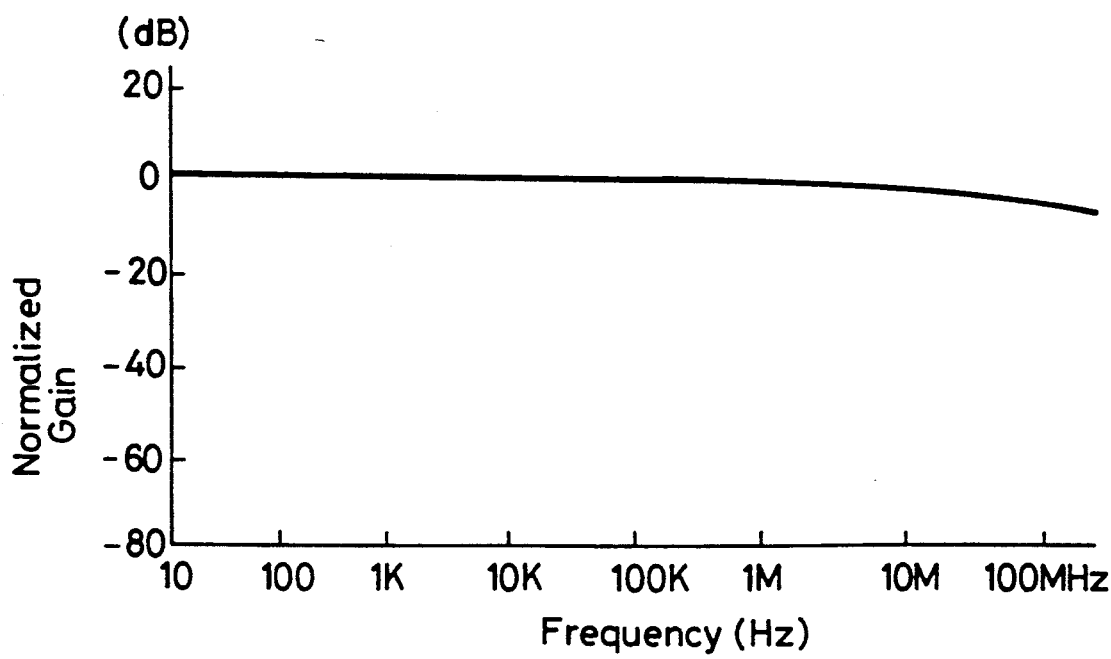
FIG. 20 is a graph used to explain a gain characteristic of the laser light resonator in the fourth embodiment.
Figure 21:
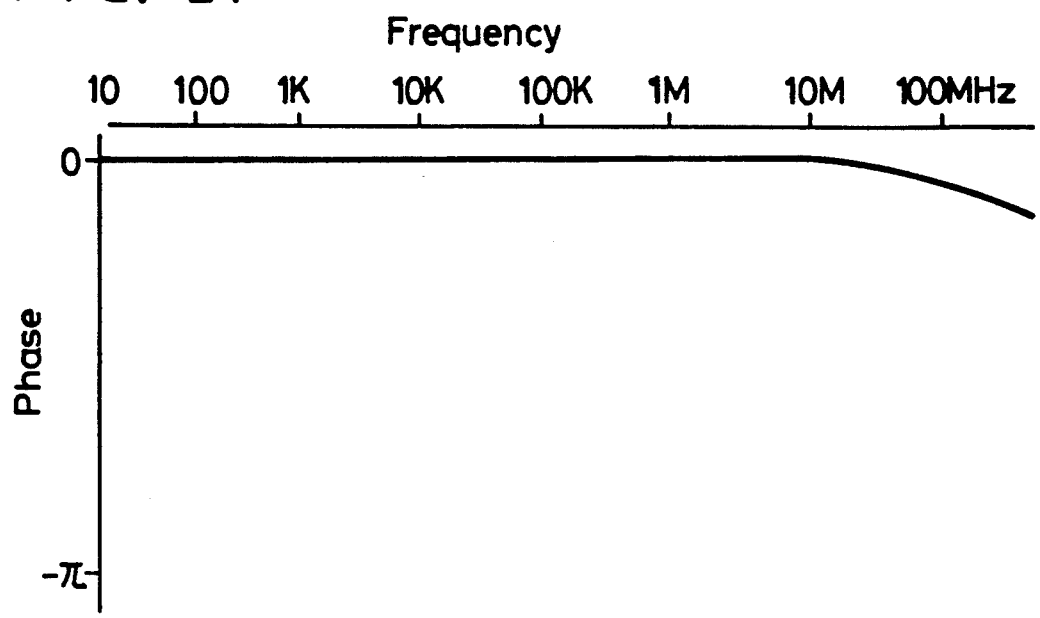
FIG. 21 is a graph used to explain a phase characteristic of the laser light resonator in the fourth embodiment.
Figure 22A:
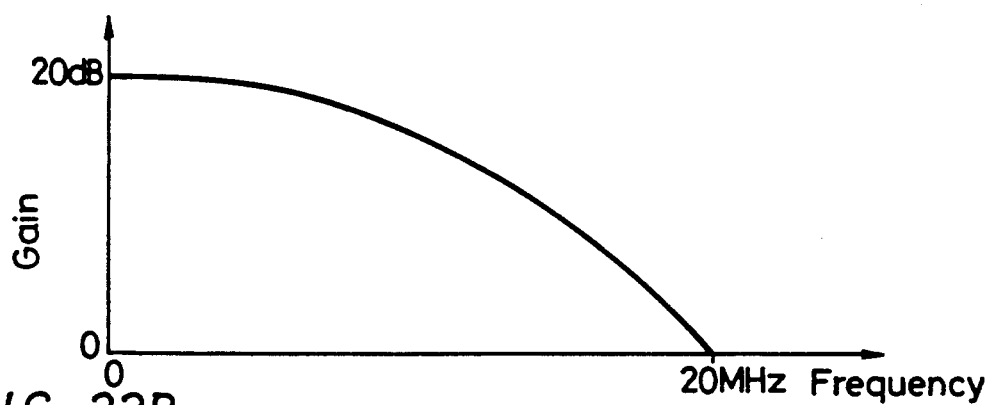
FIGS. 22A and 22B are respectively graphs used to explain phase and gain compensating characteristics of a phase compensator circuit shown in the fourth embodiment.
Figure 22B:
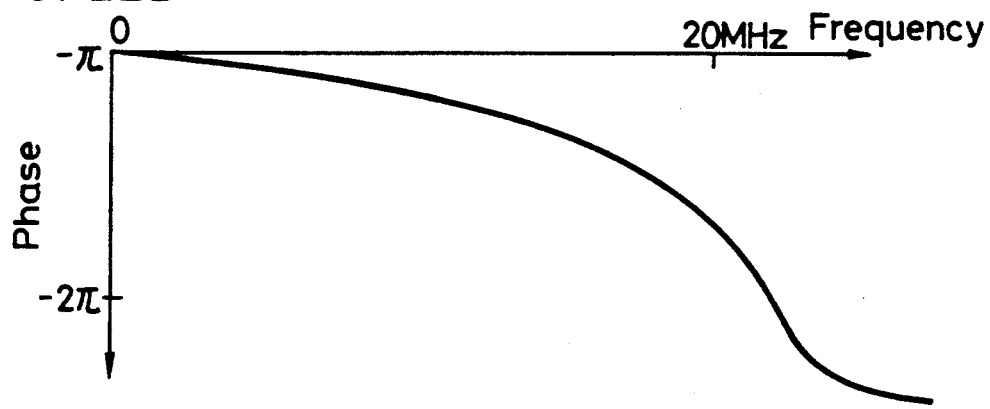

FIGS. 20 and 21 show a frequency characteristic and a phase characteristic of the fluctuated output amount of the photo-detector 41 relative to the very small fluctuation from the quasi-stable state of the pumping laser diode 1. Accordingly, the frequency characteristic and the phase characteristic of the phase compensator circuit 25 in that case are set as shown in FIGS. 22A and 22B.

When the respective elements are not sealed into the housing 11, it is possible for the user to dispose the beam splitter 61 and the photo-detector 41 at desired positions, if necessary. However, when the respective elements are sealed into the housing 11, the user can make effective use of only the laser light output from the housing 11 except for the fact that the user can supply and receive the predetermined electrical signal through the terminal 51. Therefore, when these elements are sealed into the housing 11, it is preferable that, as described in the foregoing embodiments, the respective elements such as the monitoring photo-detectors 23, 42, the beam splitters 21, 36, the beam splitter 61 or the like are housed within the housing 11 in advance together with other respective elements.

While the present invention is applied to those embodiments in which the laser light generating apparatus generates the second harmonic laser light as described above, the present invention is not limited thereto and may be applied to a laser light generating apparatus which generates a third harmonic laser light and to a laser generating apparatus which generates a laser light based on a sum frequency mixing. In other words, the present invention can be extended when the wavelength is converted in the stationary state in a nonlinear process.

According to the laser light generating apparatus of the present invention, since the laser light of first or second wavelength is detected and the intensity of the pumping laser light is controlled in response to the detected output, the noise in the pumping laser light can be suppressed from appearing in the laser light of second wavelength.

Furthermore, in accordance with the laser light generating apparatus of the present invention, since the means for monitoring the pumping laser light is provided in advance within the housing, the user can suppress, if necessary, the noise in the pumping laser light from appearing in the laser light of second wavelength.

Having described the preferred embodiments of the invention with reference to the accompanying drawings, it is to be understood that the invention is not limited to those precise embodiments and that various changes and modifications thereof could be effected by one skilled in the art without departing from the spirit or scope of the novel concepts of the invention as defined in the appended claims.

What is claimed is:

1. A laser light generating apparatus, comprising:
   a light source connected to generate an excitation light beam;
   an optical element mounted at an output of said light source to converge said excitation light beam from said light source;
   a laser medium mounted to receive said excitation light beam via said optical element to generate a laser light of a first wavelength;
   a nonlinear optical crystal element mounted to receive said laser light from said laser medium to generate a second laser light;
   reflecting means for constituting a laser resonator together with at least said laser medium and said nonlinear optical crystal element, wherein said reflecting means is composed of a pair of reflecting means and said laser medium and said nonlinear optical crystal element are disposed between said pair of reflecting means;
   detecting means for detecting a part of a light beam output from said reflecting means, wherein said detecting means includes separating means for separating said second laser light output from said reflecting means into a fundamental frequency and a second harmonic and transmitting said fundamental frequency to photodetector means and a photo-detector means for sensing said fundamental frequency laser light separated by said separating means; and
   control means for controlling said light source depending on a detected output from said detecting means, said control means including a comparator having an output connected to a phase compensation circuit which outputs a signal to an adder.

2. A laser light generating apparatus, comprising:
   a light source connected to generate an excitation light beam;
   a first optical element mounted at an output of said light source to converge said excitation light beam from said light source;
   a laser medium mounted to receive said excitation light beam via said first optical element to generate a laser light of a first wavelength;
   a nonlinear optical crystal element mounted to receive said laser light of said first wavelength to generate a second laser light;
   reflecting means for constituting a laser resonator together with at least said laser medium and said nonlinear optical crystal element;
   a second optical element for deflecting laser light along an optical axis from which said second laser light emitted from said reflecting means is emitted;
   means on which there are provided at least said light source, said first optical element, said laser medium, said nonlinear optical crystal element and said second optical element; and
   a housing for housing therein at least said light source, said first optical element, said laser medium, said nonlinear optical crystal element, said second optical element and said means.

3. The laser light generating apparatus according to claim 6, wherein said housing is provided with output means for emitting said second laser light deflected by said second optical element to the outside.

4. The laser light generating apparatus according to claim 3, wherein said means is provided on cooling means disposed within said housing.

5. The laser light generating apparatus according to claim 2, further comprising detecting means for detecting a part of light beam output from said reflecting means and control means for controlling said light source depending on a detected output from said detecting means.

6. The laser light generating apparatus according to claim 5, wherein said detecting means includes separating means for separating said first and second laser lights output from said reflecting means and photo-sensing means for sensing said first laser light separated by said separating means.

7. The laser light generating apparatus according to claim 5, wherein said detecting means includes separating means for separating a part of said second laser light output from said reflecting means and photo-sensing means for sensing said second laser light separated by said separating means.

8. The laser light generating apparatus according to claim 7, further comprising detecting means for detecting a light beam emitted from said light source and control means for controlling said light source depending on a detected output from said detecting means.

9. A laser light generating apparatus, comprising:
   a light source mounted to generate an excitation light beam;

an optical element mounted to converge said excitation light beam from said light source;

a laser medium mounted receive said excitation light beam to a laser light of a first wavelength;

a nonlinear optical crystal element mounted to receive said laser light from said laser medium to generate a second laser light;

reflecting means for constituting a laser resonator together with at least said laser medium and said nonlinear optical crystal element;

detecting means for detecting a light beam emitted from said light source; and control means for controlling said light source depending on a detected output from said detecting means, said control means including a comparator means for comparing an output of said detecting means to a referrence level, and a driving means for driving said laser medium from an output of said comparator.

10. The laser light generating apparatus according to claim 9, wherein said detecting means includes separating means disposed between said optical element and said laser medium for separating a part of said exciting light beam emitted from said light source and photosensing means for sensing the exciting light beam emitted from said light source and separated by said separating means.

11. The laser light generating apparatus according to claim 9, further comprising means on which at least said light source, said optical element, said laser medium and said nonlinear optical crystal element are disposed and a housing for housing therein at least said light source, said optical element, said laser medium, said nonlinear optical crystal element and said means.

12. A laser light generating apparatus, comprising:

a light source connected to generate an excitation light beam;

an optical element mounted to converge said excitation light beam from said light source;

a laser medium mounted to receive said excitation light beam via said optical element to generate a laser light of a first wavelength;

a nonlinear optical crystal element mounted to receive said laser light of said first wavelength to generate;

reflecting means for constituting a laser resonator together with at least said laser medium and said nonlinear optical crystal element;

deflecting means for deflecting an optical axis from which said second laser light emitted from said reflecting means is emitted;

detecting means for detecting said light beam emitted from said light source;

control means for controlling said light source depending on a detected output from said detecting means;

means on which there are provided at least said light source, said optical element, said laser medium, said nonlinear optical crystal element, said deflecting means and said detecting means; and a housing for housing therein at least said light source, said optical element, said laser medium, said nonlinear optical crystal element, said deflecting means, said detecting means and said means.

13. The laser light generating apparatus according to claim 12, wherein said housing is provided with output means for emitting said second laser light deflected by said deflecting means to the outside.

14. The laser light generating apparatus according to claim 12, wherein said means is provided on cooling means disposed within said housing.

* * * * *